(12) United States Patent
Takahashi

(10) Patent No.: US 8,779,270 B2
(45) Date of Patent: Jul. 15, 2014

(54) OPERATION DETECTION APPARATUS

(75) Inventor: Yuji Takahashi, Hamamatsu (JP)

(73) Assignee: Yamaha Corporation (JP)

( * ) Notice: Subject to any disclaimer, the term of this patent is extended or adjusted under 35 U.S.C. 154(b) by 384 days.

(21) Appl. No.: 13/182,490

(22) Filed: Jul. 14, 2011

(65) Prior Publication Data

US 2012/0011989 A1 Jan. 19, 2012

(30) Foreign Application Priority Data

Jul. 15, 2010 (JP) ................................ 2010-160474
Nov. 5, 2010 (JP) ................................ 2010-248085

(51) Int. Cl.
*G10H 7/00* (2006.01)

(52) U.S. Cl.
USPC ................................. 84/615; 84/653; 84/658

(58) Field of Classification Search
USPC ........................................... 84/615, 653, 658
See application file for complete search history.

(56) References Cited

U.S. PATENT DOCUMENTS

| | | | |
|---|---|---|---|
| 5,900,599 A | 5/1999 | Ohashi et al. | |
| 6,259,044 B1 | 7/2001 | Paratore et al. | |
| 6,570,078 B2 * | 5/2003 | Ludwig | 84/600 |
| 7,282,633 B1 * | 10/2007 | Coolidge | 84/723 |
| 7,525,032 B2 * | 4/2009 | Mishima | 84/477 R |
| 7,667,130 B2 * | 2/2010 | Mishima | 84/723 |
| 8,248,278 B2 * | 8/2012 | Schlosser et al. | 341/27 |
| 2002/0005111 A1 * | 1/2002 | Ludwig | 84/645 |
| 2003/0209132 A1 | 11/2003 | Mishima | |
| 2006/0219092 A1 | 10/2006 | Mishima | |
| 2007/0180979 A1 * | 8/2007 | Rosenberg | 84/611 |
| 2009/0007758 A1 * | 1/2009 | Schlosser et al. | 84/436 |
| 2009/0153497 A1 | 6/2009 | Jung et al. | |
| 2009/0178913 A1 * | 7/2009 | Peterson et al. | 200/5 |
| 2009/0189790 A1 * | 7/2009 | Peterson et al. | 341/22 |
| 2010/0282044 A1 * | 11/2010 | Delorme | 84/609 |
| 2011/0227763 A1 * | 9/2011 | Schlosser et al. | 341/27 |

(Continued)

FOREIGN PATENT DOCUMENTS

| | | |
|---|---|---|
| DE | 102008048448 A1 | 4/2010 |
| GB | 2275799 A | 9/1994 |

(Continued)

OTHER PUBLICATIONS

European Search Report issued in corresponding European Patent Application No. 11173938.9, dated Nov. 24, 2011.

(Continued)

*Primary Examiner* — David S. Warren
(74) *Attorney, Agent, or Firm* — Rossi, Kimms & McDowell LLP

(57) ABSTRACT

Operation detection apparatus includes a sensor section, and a pad formed of a transparent or translucent material and including at least one hitting portion provided on its surface. The hitting portion is suitable for being hit by a user. The sensor section is provided in a region positionally corresponding to the hitting portion under the pad, to detect hitting of the hitting portion. The sensor section includes a see-through portion provided in association with the hitting portion for allowing a region below the sensor section to be partly seen therethrough. The sensor section is sheet-shaped as a whole, and the see-through portion is an opening provided in a predetermined position of the sheet-shaped sensor section. Display area is located under the sensor section and exposed through the opening.

19 Claims, 9 Drawing Sheets

(56) References Cited

U.S. PATENT DOCUMENTS

| | | | |
|---|---|---|---|
| 2012/0011989 A1* | 1/2012 | Takahashi | 84/626 |
| 2012/0204704 A1* | 8/2012 | Shim et al. | 84/645 |
| 2013/0015985 A1* | 1/2013 | Peterson et al. | 341/27 |
| 2013/0180839 A1* | 7/2013 | Schlosser et al. | 200/521 |

FOREIGN PATENT DOCUMENTS

| | | |
|---|---|---|
| JP | 03-107900 A | 5/1991 |
| JP | 05-061592 A | 3/1993 |
| JP | 11-185565 A | 7/1999 |
| JP | 2010-113028 A | 5/2010 |

OTHER PUBLICATIONS

Taiwanese Office Action cited in Taiwanese counterpart application No. TW100125186, dated Sep. 26, 2013. English translation provided. (All cited references in the TWOA already made of record).

* cited by examiner

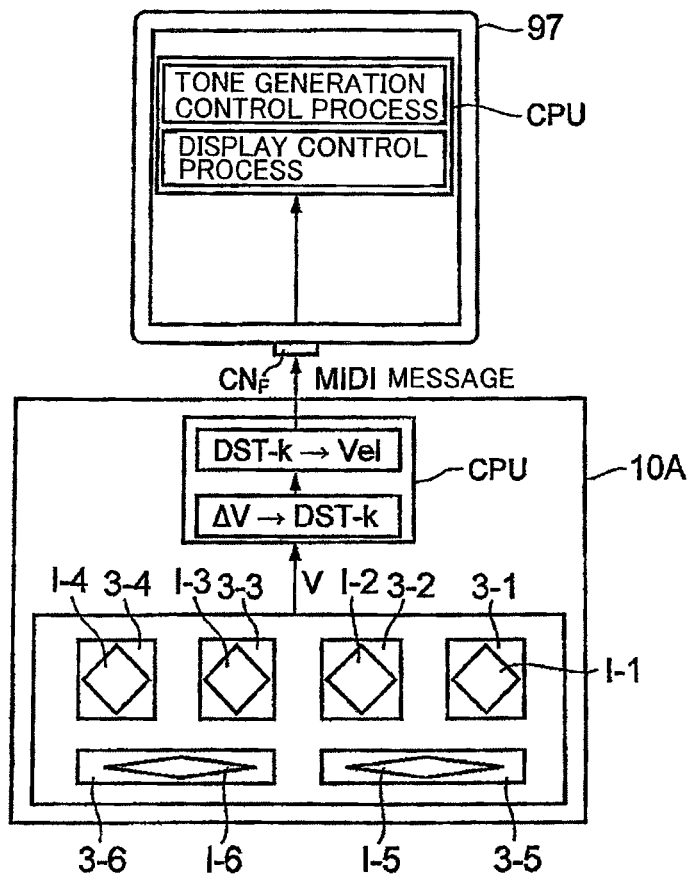
F I G. 9
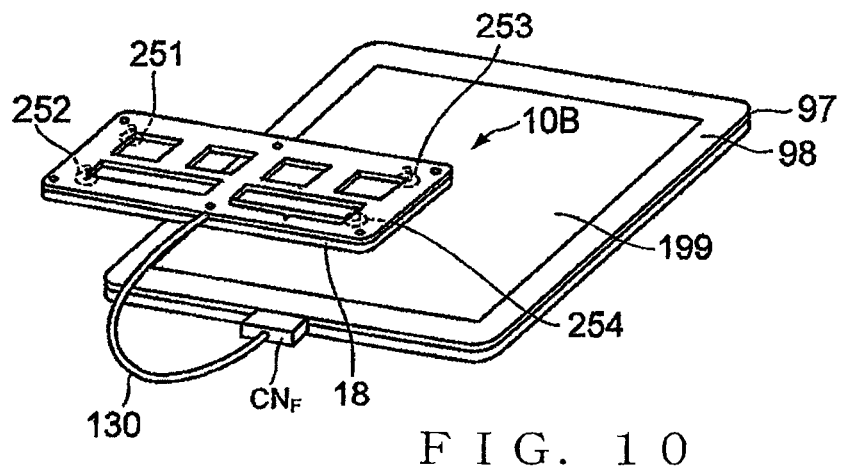
F I G. 10

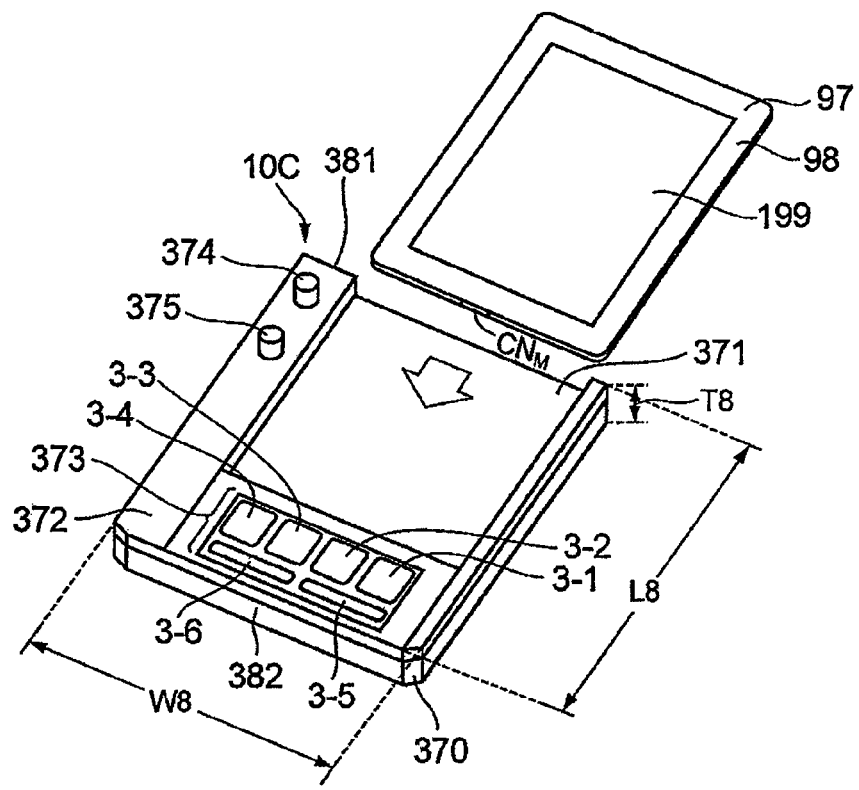
F I G. 1 1
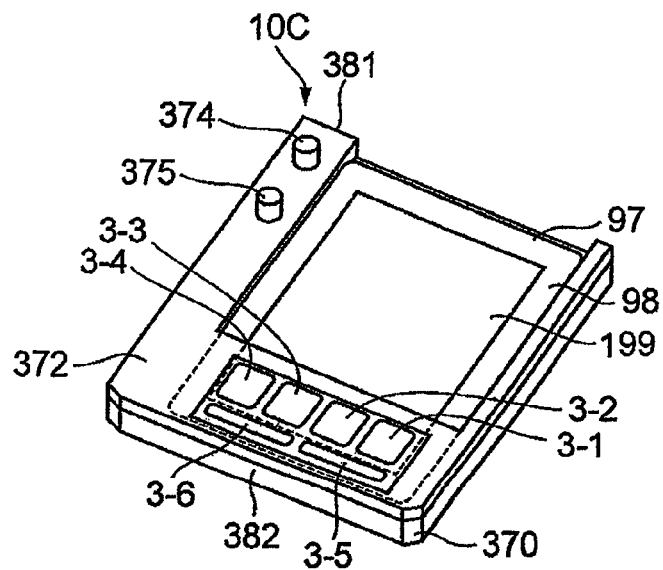
F I G. 1 2

OPERATION DETECTION APPARATUS

BACKGROUND

The present invention relates to techniques for detecting hitting, striking or beating (hereinafter referred to as "hitting") performance operation.

Among the conventionally-known electronic musical instruments are ones in which tone materials of different tone colors are allocated to a plurality of operating surfaces of a performance control and which, each time any one of the operating surfaces is hit, reproduce the tone material allocated to the hit operating surface. Examples of prior art literatures disclosing techniques related such electronic musical instruments include Japanese Patent Application Laid-open Publication No. 2010-113028 (hereinafter referred to as "relevant prior art literature"). The electronic musical instrument disclosed in the relevant prior art literature includes a total of twelve operating surfaces: six operating surfaces P1 to P6 located close to a human player or user; and six operating surfaces P7 to P12 located remote from the user. Of the twelve operating surfaces P1 to P12, the operating surfaces P1 to P6 located close to the user are oriented upwardly, while the operating surfaces P7 to P12 located remote from the user are oriented slightly obliquely toward the user with their rear ends (i.e., ends remoter from the user) located slightly higher than their front ends (i.e., ends closer to the user). Further, in the electronic musical instrument disclosed in the relevant prior art literature, tone materials simulating various percussion instruments, such as a bass drum and snare drum, are allocated to the twelve operating surfaces P1 to P12, so that, each time hitting of any one of the operating surfaces is detected, the tone material allocated to the hit operating surface is reproduced.

However, with the electronic musical instrument disclosed in the relevant prior art literature, the user cannot ascertain types of the tone materials, allocated to the individual operating surfaces, while performing. Thus, it has been necessary for the user to ascertain all of the tone materials, allocated to the individual operating surfaces, by test-hitting the individual operating surfaces before starting a performance.

SUMMARY OF THE INVENTION

In view of the foregoing, it is an object of the present invention to provide a technique for allowing a user to instantly ascertain tone materials, allocated to individual operating surfaces, during a performance of an electronic musical instrument.

In order to accomplish the above-mentioned object, the present invention provides an improved operation detection apparatus, which comprises: a pad formed of a transparent or translucent material and including at least one hitting portion provided on a surface thereof, the hitting portion being suitable for being hit by a user; and a sensor section provided in a region positionally corresponding to the hitting portion under the pad for detecting hitting, by the user, of the hitting portion, the sensor including a see-through portion provided in association with the hitting portion for allowing a region below the sensor section to be partly seen therethrough.

Because the see-through portion for allowing a region below the sensor section to be partly seen therethrough is provided in association with the hitting portion, the user can hit the hitting portions while viewing a display presented under the hitting portion of the pad and seen through the see-through portion. Thus, by a mark or image indicative of a tone material allocated to the hitting portion being displayed under the hitting portion, the user is allowed to execute an intuitive performance.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which:

FIG. 9 is a diagram explanatory of performance processing performed by the operation detection apparatus and tablet-type computer of FIG. 8;

FIG. 10 is a view showing example constructions of a third embodiment of the operation detection apparatus and a tablet-type computer to which the third embodiment of the operation detection apparatus is attached;

FIG. 11 is a view showing example constructions of a fourth embodiment of the operation detection apparatus and a tablet-type computer accommodated in the operation detection apparatus;

FIG. 12 is a view showing the tablet-type computer accommodated in the fourth embodiment of the operation detection apparatus;

DETAILED DESCRIPTION

[First Embodiment]

Figure 1A:
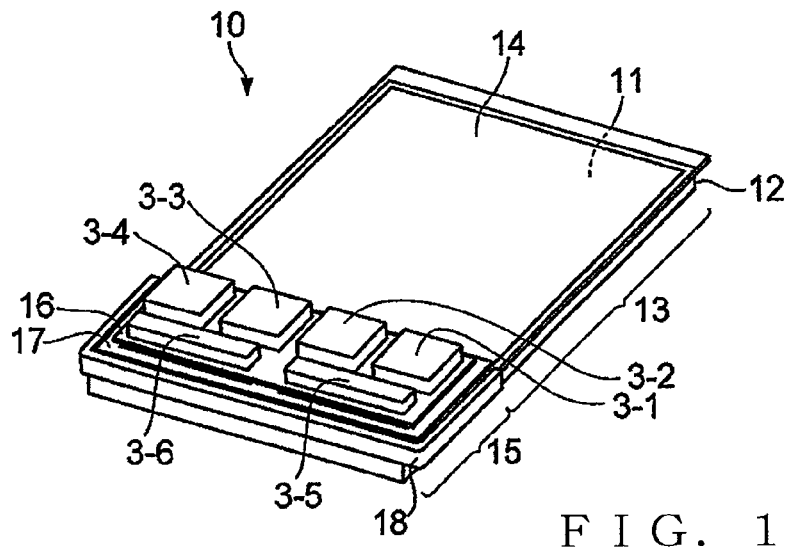
FIGS. 1A and 1B are views showing a construction of a first embodiment of an operation detection apparatus of the present invention.
Figure 1B:
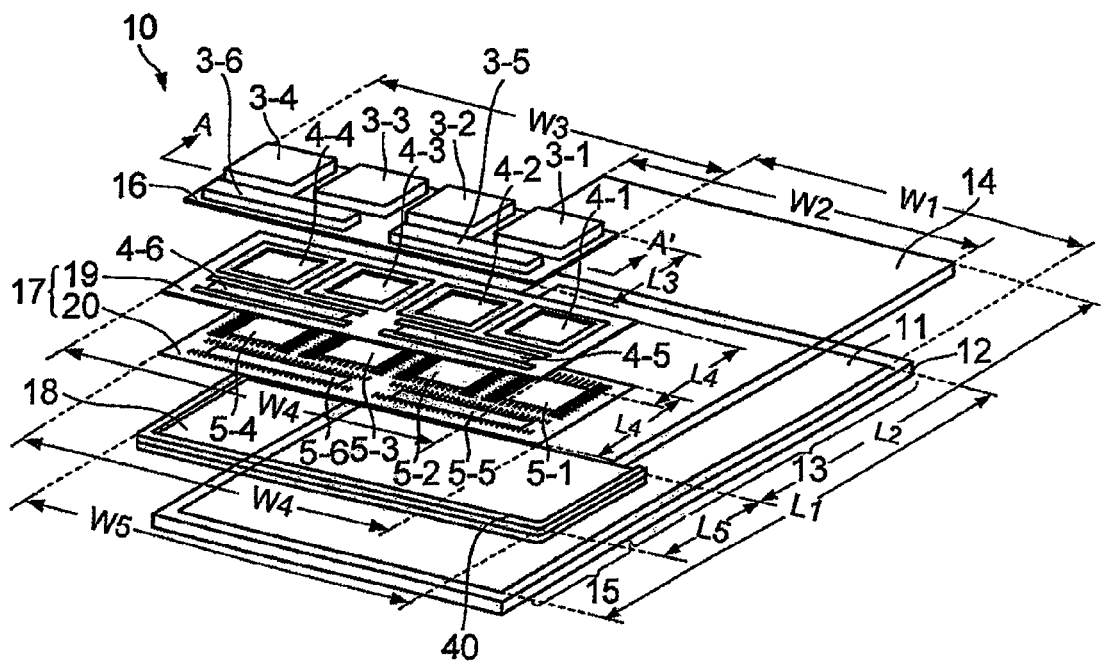
Figure 2:
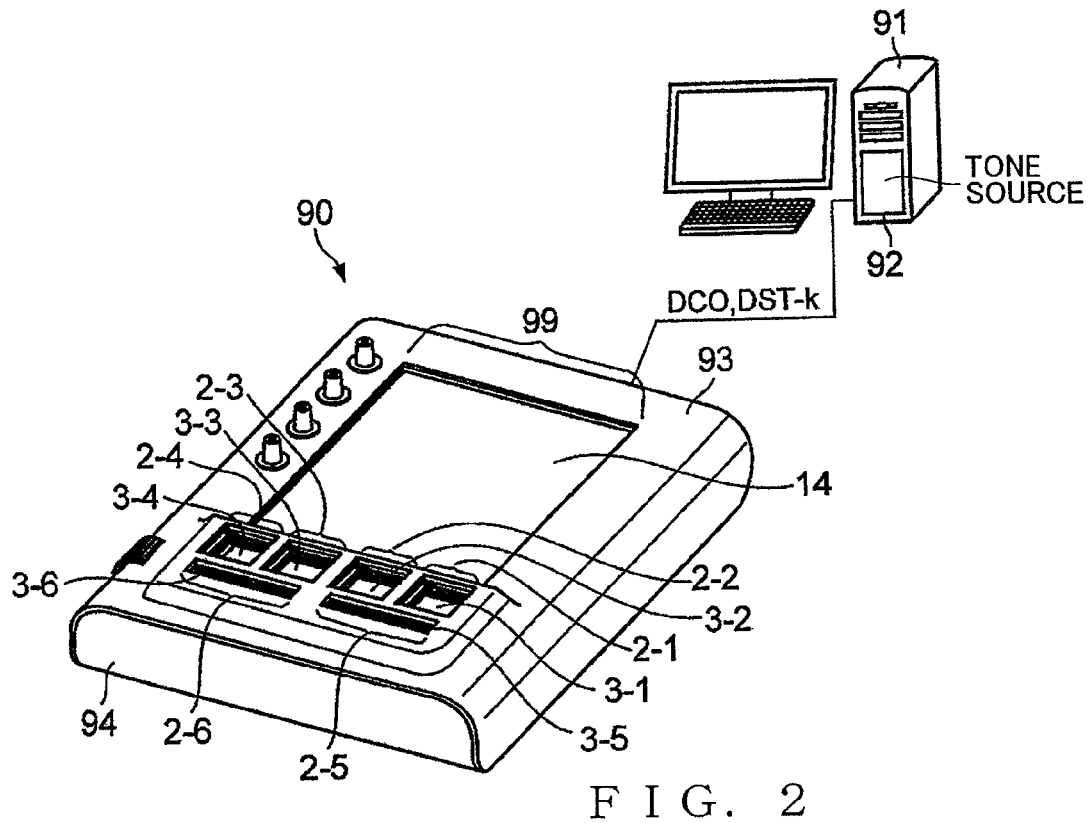
FIG. 2 is a view showing an operation terminal having the operation detection apparatus incorporated therein, and a personal computer connected with the operation terminal.

FIG. 1A is a perspective view showing a construction of an operation detection apparatus 10 according to a first embodiment of the present invention, and FIG. 1B is an exploded view of the operation detection apparatus 10. FIG. 2 is a view showing an operation terminal 90 having the operation detection apparatus 10 incorporated therein, and a personal computer 91 connected with the operation terminal 90. FIG. 2 is a view showing an operation terminal 90 having the operation detection apparatus 10 incorporated therein, and a personal computer 91 connected with the operation terminal 90. The operation detection apparatus 10 not only performs various displays in accordance with instructions given from the personal computer 91, but also detects operation for selecting from among various tone material data (data for use as materials for creating tones, in other words tone control data) and instruction reproduction of tone material data and supplies the personal computer 91 with signals indicative of the detected operation.

As shown in FIGS. 1A and 1B, the operation detection apparatus 10 includes: an LCD (Liquid Crystal Display) 12 that is a flat display panel having a display surface 11 of a horizontal dimension (i.e., width) W1 and longitudinal dimension (i.e., length) L1; a transparent touch panel 14 laid over a display area 13 provided on a part of the LCD 12; and a transparent rigid member 18, membrane sheet 17 and transparent pad frame 16 provided in layers on a remaining display area 15, other than the display area 13, of the display area 13. As shown in FIG. 2, the operation detection apparatus 10 is accommodated in a casing of the operation terminal 90, and the casing comprises a lid portion 93 and a tray portion 94 fitted with each other. The touch panel 14 is exposed through an opening 99 provided in the lid portion 93, and hitting portions 3-k (k=1-6) are exposed through openings 2-k (k=1-6) provided in the lid portion 93. The display means employed in the operation detection apparatus 10 is not limited to an LCD and may be another type of flat panel display.

As shown in FIGS. 1A and 1B, the LCD 12 displays various images in accordance with display signals transmitted from the personal computer 91, as will be described in detail later. Note that the operation terminal 90 may be applied to other computing devices than the personal computer 91, such as a portable terminal.

The touch panel 14, which is for example of an analog resistance film type, has a horizontal dimension (width) W2 and longitudinal dimension (length) L2 slightly greater than those of the display area 13. Once a finger or hand of the user touches a point of the touch panel 14, the touch panel 14 detects an X-coordinate value (i.e., coordinate value in a direction of the horizontal dimension W2) and Y-coordinate value (i.e., coordinate value in a direction of the longitudinal dimension L2) of the touched point. The X-coordinate value and Y-coordinate value detected by the touch panel 14 are converted by a not-shown A/D converter from analog signals into digital signals that are then transmitted to the personal computer 91 as coordinate value data DCO.

Figure 3:
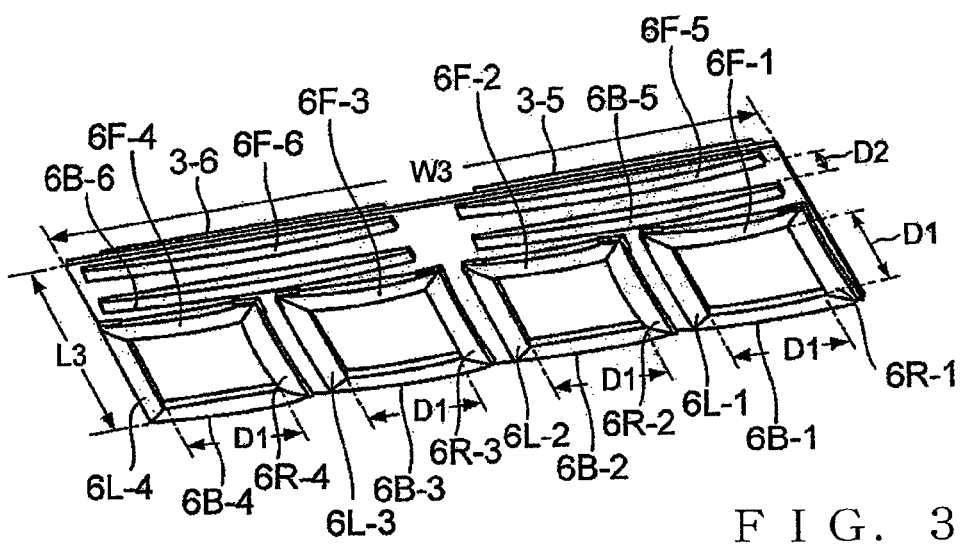
FIG. 3 is a perspective view of a transparent pad frame provided in the detection apparatus as viewed from the side of a membrane sheet.
Figure 4:
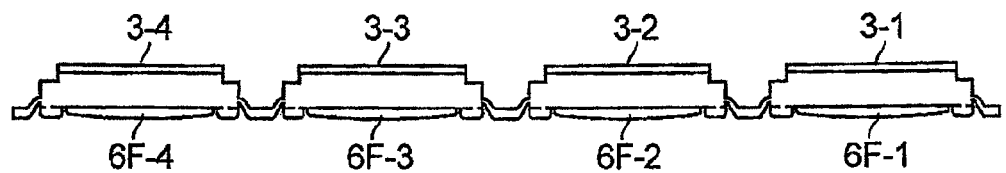
FIG. 4 is a sectional view of the transparent pad frame taken along the A-A' line of FIG. 1B.

The transparent pad frame 16 is a frame-shaped member formed of transparent silicon rubber and integrally including a plurality of (six in the illustrated example) transparent pads. The transparent pad frame 16 has a horizontal dimension (width) W3 and longitudinal dimension (length) L3 that are substantially equal to those of the display area 15 (L3≈L1−L2). FIG. 3 is a perspective view of the transparent pad frame 16 as viewed from the side of the membrane sheet 17, and FIG. 4 is a sectional view of the transparent pad frame 16 taken along the A-A' line of FIG. 1B. The transparent pad frame 16 has the hitting portions 3-k (k=1-6) on its surface. As shown in FIGS. 1B and 4, the hitting portions 3-1 to 3-4 of the hitting portions 3-k (k=1-6) are formed by upwardly projecting four square regions of the surface of the transparent pad frame 16, which are equal in size to square openings 2-1 to 2-4 of the lid portion 93, into a thickness equal to or slightly greater than a thickness of the openings 2-1 to 2-4. Further, the hitting portions 3-5 and 3-6 of the hitting portions 3-k (k=1-6) are formed by upwardly projecting two rectangular regions of the surface of the transparent pad frame 16, which are equal in size to rectangular openings 2-5 and 2-6 of the lid portion 93, into a thickness equal to or slightly greater than a thickness (depth) of the openings 2-5 and 2-6. As shown in FIG. 2, the operation detection apparatus 10 is accommodated in the operation terminal 90 with the hitting portions 3-k (k=1-6) fitted in respective ones of the openings 2-k (k=1-6) of the lid portion 93.

As shown in FIGS. 3 and 4, the transparent pad frame 16 has, on its reverse (i.e., underside or inner) surface, pusher portions 6F-k (k=1-6), 6B-k (k=1-6), 6L-k (k=1-6) and 6R-k (k=1-6) opposed to the membrane sheet 17. The pusher portions 6F-1, 6B-1, 6L-1 and 6R-1 are formed by projecting, toward the membrane sheet 17, reverse surface regions of the transparent pad frame 16 that positionally correspond to the peripheral edge of the hitting portion 3-1, i.e. on the reverse side of the peripheral edge of the hitting portion 3-1 or opposite from the peripheral edge of the hitting portion 3-1. The pusher portions 6F-2, 6B-2, 6L-2 and 6R-2 are formed by projecting, toward the membrane sheet 17, reverse surface regions of the transparent pad frame 16 that positionally correspond to the peripheral edge of the hitting portion 3-2, i.e. on the reverse side of the peripheral edge of the hitting portion 3-2 or opposite from the peripheral edge of the hitting portion 3-2. The pusher portions 6F-3, 6B-3, 6L-3 and 6R-3 are formed by projecting, toward the membrane sheet 17, reverse surface regions of the transparent pad frame 16 that positionally correspond to the peripheral edge of the hitting portion 3-3, i.e. on the reverse side of the peripheral edge of the hitting portion 3-3 or opposite from the peripheral edge of the hitting portion 3-3, and the pusher portions 6F-4, 6B-4, 6L-4 and 6R-4 are formed by projecting reverse surface regions of the transparent pad frame 16 that positionally correspond to the peripheral edge of the hitting portion 3-4, i.e. on the reverse side of the peripheral edge of the hitting portion 3-4 or opposite from the peripheral edge of the hitting portion 3-4.

More specifically, the pusher portions 6F-1 to 6F-4 and the pusher portions 6B-1 to 6B-4 extend in the direction of the horizontal dimension direction W3 of the transparent pad frame 16. Each of the pusher portions 6F-1 to 6F-4 and 6B-1 to 6B-4 gently protrudes arcuately toward the membrane sheet 17 in such a manner that it has the greatest thickness at its middle (or substantially middle) point in the horizontal dimension direction W3. The pusher portions 6F-1 to 6F-4 and the pusher portions 6B-1 to 6B-4 are spaced from each other by a distance D1. Further, the pusher portions 6L-1 to 6L-4 and the pusher portions 6R-1 to 6R-4 extend in a direction of the longitudinal dimension direction L3 of the transparent pad frame 16. Each of the pusher portions 6L-1 to 6L-4 and 6R-1 to 6R-4 gently protrudes arcuately toward the membrane sheet 17 in such a manner that it has the greatest thickness at its middle (or substantially middle) point in the longitudinal dimension direction L3. The pusher portions 6L-1 to 6L-4 and the pusher portions 6R-1 to 6R-4 are spaced from each other by a distance D1.

The pusher portions 6F-5 and 6F-5 are formed by projecting, toward the membrane sheet 17, reverse surface regions of the transparent pad frame 16 that positionally correspond to two sides of the hitting portion 3-5 that are opposed to each other in the longitudinal dimension direction L3. Similarly, the pusher portions 6F-6 and 6B-6 are formed by projecting reverse surface regions of the transparent pad frame 16 that positionally correspond to two sides of the peripheral edge of the hitting portion 3-6 that are opposed to each other in the longitudinal dimension direction L3.

More specifically, the pusher portions 6F-5, 6B-5, 6F-6 and 6B-6 extend in the direction of the horizontal dimension direction W3 of the transparent pad frame 16, and each of the pusher portions 6F-5, 6B-5, 6F-6 and 6B-6 gently protrudes arcuately toward the membrane sheet 17 in such a manner that it has the greatest thickness at its middle (or substantially middle) point in the horizontal dimension direction W3. The pusher portions 6F-5 to 6B-5 are spaced from each other by a distance D2, and the pusher portions 6F-6 to 6B-6 are spaced from each other by a distance D2. Namely, each of the pusher portions includes at least one straight line portion positionally corresponding to at least one side of the peripheral edge of the corresponding hitting portion, and the one straight line portion has a thickness (or width) varying in such a manner that the thickness (or width) is the greatest at its substantial middle point.

As shown in FIG. 1B, the membrane sheet 17 interposed between the transparent pad frame 16 and the display area 15 is a sensor that, on the reverse surface (underside surface) of the transparent pad frame 16, detects hitting, by the user, of any one of the hitting portions 3-k. The membrane sheet 17 comprises two flexible sheets 19 and 20 each functioning as a pressure sensitive member. Each of the flexible sheets 19 and 20 has horizontal and longitudinal dimensions (i.e., width and length) W4 and L4 slightly greater than those of the transparent pad frame 16. The flexible sheet 19 has openings 4-k (k=1-6) formed in its regions immediately under the hitting portions 3-k (k=1-6). The flexible sheet 20 also has openings 5-k (k=1-6) formed in its regions immediately under the hitting portions 3-k (k=1-6). The hitting portions 3-k located immediately over the openings 4-k and 5-k are formed of a transparent material. Thus, visual displays made in the display area 15 of the LCD 12 immediately under the openings 4-k and 5-k are exposed outside through the openings 4-k and 5-k and hitting portions 3-k.

Figure 5:
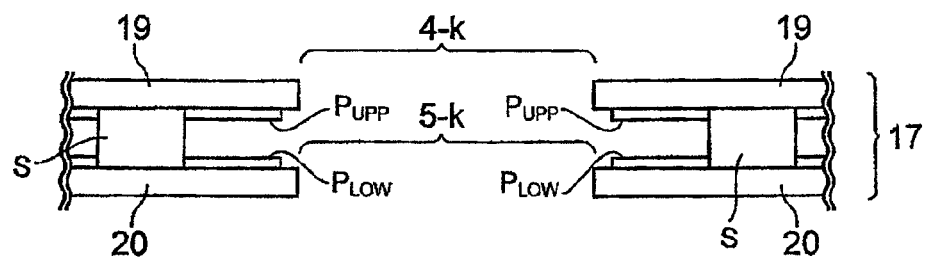
FIG. 5 is a sectional view of flexible sheets provided in the detection apparatus.

As shown in a sectional view of FIG. 5, contact electrodes P$_{UPP}$ are provided on the reverse (inner) surface of the flexible sheet 19 around the openings 4-k. The contact electrodes P$_{UPP}$ are each formed, example, by screen-printing carbon paste on the reverse (inner) surface of the flexible sheet 19. A copper foil pattern comprising contact electrodes P$_{LOW}$ and electric leads (not shown) is provided on the inner surface of the flexible sheet 20 around the openings 4-k. Spacers S are provided between adjoining ones of the openings 4-k and 5-k of the flexible sheets 19 and 20, and each of the spacers S extends between the flexible sheets 19 and 20 so that the contact electrodes P$_{UPP}$ on the inner surface of the flexible sheet 19 and the contact electrodes P$_{LOW}$ on the inner surface of the flexible sheet 20 are spaced from each other by a gap corresponding to the thickness of the spacer S. The spacers S also function to prevent the contact electrodes P$_{UPP}$, which are adjoining sensors provided around the openings 4-k, from being pressed due to user's erroneous operation.

Each of pairs of the contact electrodes P$_{UPP}$ provided on the reverse or inner surface of the flexible sheet 19 and the contact electrodes P$_{LOW}$ provided on the inner surface of the flexible sheet 20 functions as a switch that turns on in response to hitting of a corresponding one of the hitting portions 3-k. More specifically, as any one of the hitting portions 3-k (k=1-6) is hit by the user, the thus-hit hitting portion 3-k (e.g., 3-1) and the pushers 6F-1, 6B-1, 6L-1 and 6R-1 provided on the reverse side of the hitting portion 3-1 flex. The pushers 6F-1, 6B-1, 6L-1 and 6R-1 having thus flexed press a peripheral portion of the opening 4-1 formed in the flexible sheet 19 (i.e., edge portion of the flexible sheet 19 defining the opening 4-1), so that the peripheral portion of the opening 4-1 approaches a peripheral portion of the opening 5-1 formed in the flexible sheet 20 (i.e., edge portion of the flexible sheet 20 defining the opening 5-1). Then, the contact electrode P$_{UPP}$ and the contact electrode P$_{LOW}$ contact each other, so that an output voltage V obtained from the copper foil pattern formed on the flexible sheet 20 increases as an area of the contact between the contact electrode P$_{UPP}$ and the contact electrodes P$_{LOW}$ increases. Then, the output voltage V is converted by the not-shown A/D converter from an analog signal into a digital signal that is transmitted to the personal computer 91 as hitting intensity value data DST-1 indicative of an intensity of the hitting of (i.e., hitting force applied to) the hitting portion 3-1. Pressure sensitive members employed in the instant embodiment are not limited to the contact electrodes and may be any other suitable types of members formed of conductive rubber etc.

In FIGS. 1A and 1B, the transparent rigid member 18 is a plate-shaped member formed of a transparent plastic material. The transparent rigid member 18 has a horizontal dimension W5 and longitudinal dimension L5 slightly greater than those of the display area 15. A protruding portion 40 having a small width is formed on opposite end portions, in a direction of the horizontal dimension W5, of the transparent rigid member 18 and on a side portion, opposite from the display area 13, of the transparent rigid member 18. The transparent rigid member 18 is supported, via a not-shown support member fixed to an inner peripheral wall of the tray portion 94 of the operation terminal 90, over the display area 15 with a slight gap left therebetween. The transparent pad frame 16 and the flexible sheets 19 and 20 have their respective side surfaces abutted against the inner side surfaces of the protruding portion 40, so that transparent pad frame 16 and the flexible sheets 19 and 20 are retained inside the protruding portion 40 of the transparent rigid member 18. The foregoing are details of the construction of the operation detection apparatus 10.

Next, a description will be given about behavior of the first embodiment. A performance support program for imparting the following four functions to a CPU of the personal computer 91 is prestored on a hard disk (not shown) of the personal computer 91.

a1. Tone Material Search Function:

This function is designed to cause a search condition entry field, intended for the user to enter one or more tone material data search conditions, to be displayed in the display area 15 of the operation detection apparatus 10, and searches a tone source 92 for tone material data having a character meeting the search conditions entered in the search condition entry field.

b1. Tone Material Allocation Function:

This function is designed to allocate tone material data, searched out from the tone source 92 as noted above, to the hitting portions 3-k (k=1-6) in one-to-one relation.

c1. Icon Display Function:

This function is intended to display icons, indicative of the individual searched-out tone material data, immediately under the hitting portions 3-k (k=1-6) having the tone material data allocated thereto.

d1. Tone Material Reproduction Function:

Each time any one of the hitting portions 3-k of the operation detection apparatus 10 is hit by the user, this function reproduces tone material data allocated to the hit hitting portion 3-k.

Figure 6:
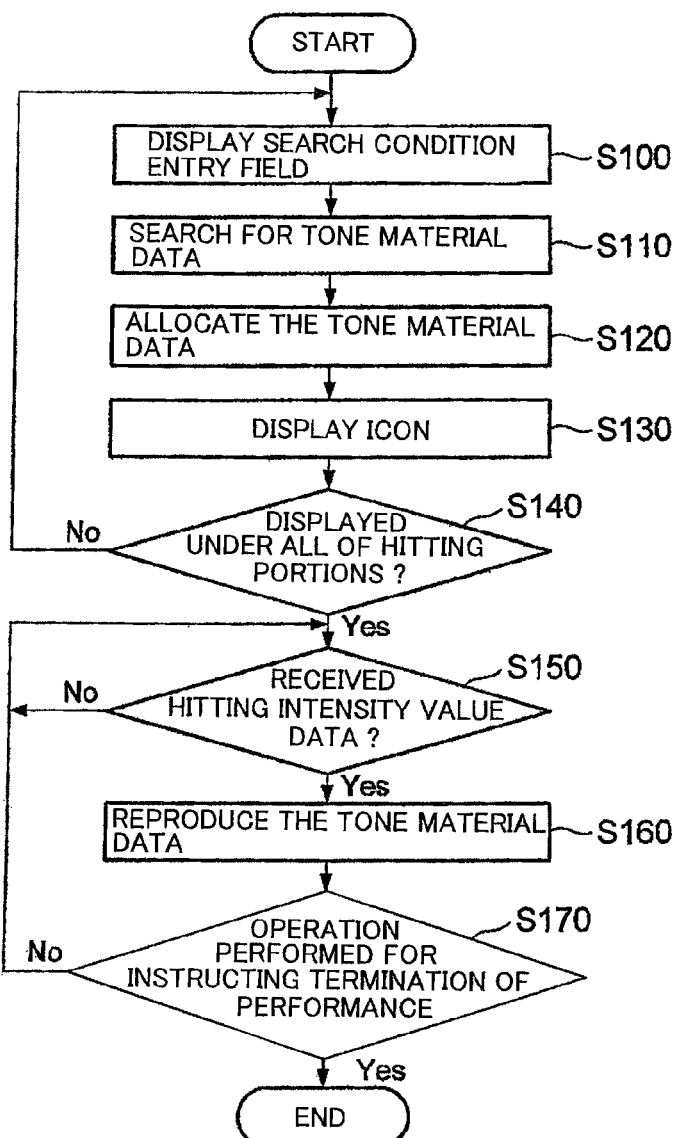
FIG. 6 is a flow chart explanatory of behavior of the first embodiment.

FIG. 6 is a flow chart explanatory of the behavior of the instant embodiment. In FIG. 6, the CPU of the personal computer 91 displays the search condition entry field in the display area 13 of the operation detection apparatus 10, at step S100. A user enters one or more search conditions into the search condition entry field. Entry of the search conditions may be performed by the user displaying a software keyboard in the display area 13 and selecting, one by one, letters, characters, etc. on the software keyboard. Once one or more search conditions are entered into the search condition entry field by the user, the CPU of the personal computer 91 searches the tone source 92 for tone material data most matching the entered search conditions, at step S110.

Figure 7:
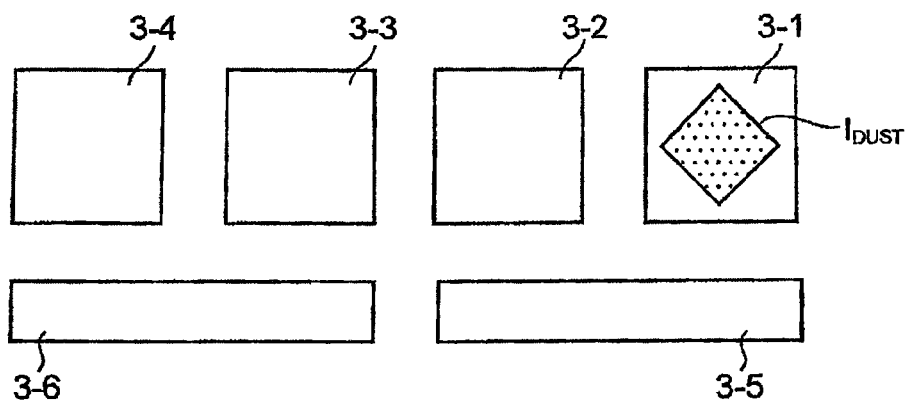
FIG. 7 is a diagram showing icons displayed in a display area of an LCD shown in FIGS. 1A and 1B.

After the tone material data most matching the entered search conditions has been searched out from the tone source 92, the CPU of the personal computer 91 selects any one of the hitting portions 3-k having no tone material data currently allocated and allocates the searched-out tone material data to the selected hitting portion 3-k, at step S120. Then, the CPU of the personal computer 91 displays an icon indicative of the allocated tone material data immediately under the hitting portion 3-k to which the tone material data has been allocated, at step S130. FIG. 7 shows an example of the icon displayed. In the illustrated example of FIG. 7, an icon I$_{DUST}$ of a sand pattern, indicating that the tone material data allocated to the hitting portion 3-1 represents a "dusty" tone material, is displayed immediately under the hitting portion 3-1.

A series of the aforementioned operations of steps S100 to S130 is repeated until icons have been displayed immediately under all of the hitting portions 3-k (k=1-6). Upon displaying of six icons immediately under all of the hitting portions 3-k (k=1-6) (YES determination at step S140), the user starts a performance, in which the user hits, with his or her own hands, desired one or more of the hitting portions 3-k (k=1-6). As noted above, each time any one of the hitting portions 3-k is hit, the operation detection apparatus 10 transmits, to the personal computer 91, hitting intensity value data DST-k indicative of a hitting intensity of the hitting portion 3-k. Each time the CPU receives, from the operation detection apparatus 10, such hitting intensity value data DST-k indicative of the hitting intensity of the hitting portion 3-k (YES determination at step S15), it reproduces the tone material data, allocated to the hitting portion 3-k, as a tone of a velocity (tone volume) corresponding to the hitting intensity, at step S160. Once operation is performed by the user for instructing termination of the performance (YES determination at step S170), the CPU terminates the current processing.

The first embodiment of the operation detection apparatus 10 constructed in the above-described manner can achieve the following advantageous benefits. Namely, in the first embodiment of the operation detection apparatus 10, the transparent rigid member 18 is provided on the display area 15, the membrane sheet 17 is provided on the transparent rigid member 18, and the transparent pas frame 16 is provided on the membrane sheet 17. The transparent rigid member 18 and the transparent pad frame 16 are each made of a transparent material. The membrane sheet 17 has the openings 4-k and 5-k formed immediately under the hitting portions 3-k, and the contact electrodes P$_{UPP}$ and P$_{LOW}$ that constitute sensors for detecting hitting of the hitting portions 3-k are provided around the openings 4-k and 5-k. With the operation detection apparatus 10 thus arranged, icons displayed in the display area 15 can be seen through the hitting portions 3-k, but the contact electrodes P$_{UPP}$ and P$_{LOW}$ are invisible by being hidden by the edge portions of the membrane sheet 17 defining the openings 4-k and 5-k. In this way, the user can comfortably execute an intuitive performance where the user hits the hitting portions 3-k while viewing the icons.

Further, in the first embodiment of the operation detection apparatus 10, each of the pusher portions 6F-1 to 6F-4 and 6B-1 to 6B-4 gently protrudes arcuately toward the membrane sheet 17 in such a manner that it has the greatest thickness at its middle (or substantially middle) point in the horizontal dimension direction W3. Further, each of the pusher portions 6L-1 to 6L-4 and 6R-1 to 6R-4 gently protrudes arcuately toward the membrane sheet 17 in such a manner that it has the greatest thickness at its middle (or substantially middle) point in the longitudinal dimension direction L3. Furthermore, each of the pusher portions 6F-5, 6B-5, 6F-6 and 6B-6 gently protrudes arcuately toward the membrane sheet 17 in such a manner that it has the greatest thickness at its middle (or substantially middle) point in the horizontal dimension direction W3. Thus, when any one of the hitting portions 3-k has been hit with a small hitting force, a peripheral portion of the corresponding opening 4-k of the flexible sheet 19 is pressed only by a slight region in the neighborhood of the middle point of the pusher portion 6F-k, 6B-k, 6L-k or 6R-k, while, when any one of the hitting portions 3-k has been hit with a great hitting force, a peripheral portion of the corresponding opening 4-k of the flexible sheet 19 is pressed by a wider region of the pusher portion 6F-k, 6B-k, 6L-k or 6R-k. Thus, in the first embodiment of the operation detection apparatus 10, the intensity of the force with which any one of the hitting portions 3-k is hit can be accurately converted into a velocity corresponding to the hitting force.

Furthermore, in the first embodiment of the operation detection apparatus 10, the transparent rigid member 18 is supported over the display area 15 with a slight gap left therebetween, and layers of the membrane sheet 17 and transparent pad frame 16 are provided on the transparent rigid member 18. Thus, even when any one of the hitting portions 3-k has been hit on the membrane sheet 17, no load is applied to the LCD 12. In this way, the first embodiment can prevent the LCD 12 from deteriorating due to a load applied thereto.

[Second Embodiment]

Figure 8:
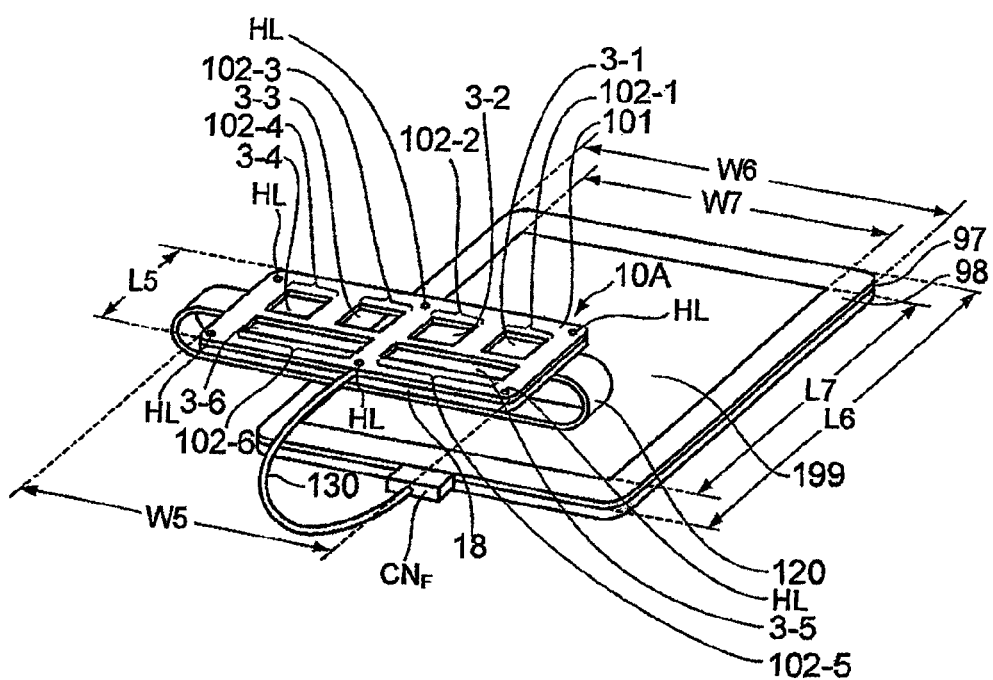
FIG. 8 is a view showing example constructions of a second embodiment of the operation detection apparatus and a tablet-type computer to which the operation detection apparatus is attached.

FIG. 8 is a view showing example constructions of a second embodiment of the operation detection apparatus 10A and a tablet-type computer 97 to which the operation detection apparatus 10A is attached. The tablet-type computer 97 is of a rectangular parallelepiped shape having a horizontal dimension (width) W6 and longitudinal dimension (length) L6. A display surface 199 of an LCD (flat display device) having a horizontal dimension (width) W7 and longitudinal dimension (length) L7 slightly smaller than those of a surface 98 of the tablet-type computer 97 is exposed on the surface 98. The horizontal dimension W7 of the display surface 199 is substantially equal to the horizontal dimension W5 of the operation detection apparatus 10A, and the longitudinal dimension L7 of the display surface 199 is sufficiently greater than the longitudinal dimension L5 of the operation detection apparatus 10A. Further, a connector CNM (not shown in FIG. 8) having a plurality of types of pins, such as an audio outputting pin, video outputting pin, USB (Universal Serial Bus) connecting pin, power connecting pin and grounding pin, is provided on one end surface, in a direction of the longitudinal dimension L6, of the tablet-type computer 97. As known in the art, the display surface 199 of the tablet-type computer 97 is constructed as a transparent touch panel.

The second embodiment of the operation detection apparatus 10A includes: the transparent rigid member 18, membrane sheet 17 (not shown in FIG. 8) and transparent pad frame 16 (only the hitting portions 3-k (k=1-6) of which are shown in FIG. 8) similar to those in the first embodiment of the operation detection apparatus 10 shown in FIGS. 1A and 1B; a cover 101 that covers the transparent rigid member 18, membrane sheet 17 and transparent pad frame 16 from above; a connector CNF that constitutes a pair with the connector CNM of the tablet-type computer 97; a band 120 of rubber; a CPU (not shown in FIG. 8) that is a control center of the operation detection apparatus 10A; and a cable 130 that constitutes a signal transfer passage from the CPU to the connector CNF.

More specifically, in the second embodiment of the operation detection apparatus 10A, the transparent rigid member 18, membrane sheet 17, transparent pad frame 16 and cover 101 are provided in layers. The cover 101 is formed of a non-transparent material in a rectangular parallelepiped shape having the same horizontal dimension W5 and longitudinal dimension L5 as the transparent rigid member 18. The cover 101 has six screw holes HL, i.e. four corner screw holes formed in its four corner portions and two middle screw holes between the corner screw portions spaced from each other in the direction of the horizontal dimension W5. The transparent rigid member 18 too has six screw holes HL, i.e. four corner screw holes formed in its four corner portions and two middle screw holes between the corner screw holes spaced from each other in the direction of the horizontal dimension W5. The cover 101 and the transparent rigid member 18 are fixed to each other with a CPU interposed therebetween by means of screws screwed in the corner holes and middle screw holes.

The cover 101 has openings 102-k (k=1-6) similar to the openings 2-k (k=1-6) provided in the lid portion 93 (FIG. 2) of the operation terminal 90 having the first embodiment of the operation detection apparatus 10 incorporated therein, and the hitting portions 3-k (k=1-6) of the transparent pad frame 16 are exposed through the openings 102-k (k=1-6).

The rubber band 120 is curled from the reverse side of the transparent rigid member 18 to the operation detection apparatus 10. The rubber band 120 is fixed at its opposite ends, in the direction of the horizontal dimension W5, of the cover 101. Further, the cable 130 extends from a middle point of one of opposite side surfaces, in the direction of the longitudinal dimension L5, of the cover 101, and the connector CNF is connected to the leading end of the cable 130.

The second embodiment of the operation detection apparatus 10A is attached to the tablet-type computer 97 in the following manner. First, the band 120 of the operation detection apparatus 10A is expanded in the direction of the horizontal dimension W5, the tablet-type computer 97 is passed through a loop defined by the band 120 and the reverse surface of the transparent rigid member 18, and then the band 120 is tightened. Next, the connector CNF of the operation detection apparatus 10A is connected to the connector CNM of the tablet-type computer 97. After that, a performance support program installed in the tablet-type computer 97 is started up. Upon start-up of the performance support program, a CPU of the tablet-type computer 97 and the CPU of the operation detection apparatus 10A execute performance processing in conjunction with each other. In this way, the operation detection apparatus 10A functions as an auxiliary input device of the tablet-type computer 97.

FIG. 9 is a diagram explanatory of the performance processing. The CPU of the tablet-type computer 97 displays six icons I-k (k=1-6), which are visual representations arranged in the same positional relationship as the hitting portions 3-k (k=1-6), in a middle region, in the direction of the horizontal dimension W7, of the display surface 199 located under the hitting portions 3-k. The user starts a performance after adjusting the attached position of the tablet-type computer 97 so that the individual icons I-k displayed under the hitting portions 3-k can be seen through the hitting portions 3-k of the computer 97. In the performance, the user hits, with his or her own hands, desired one or more of the hitting portions 3-k (k=1-6).

The CPU of the operation detection apparatus 10A detects presence of hitting of any one of the hitting portions 3-k (k=1-6) from output voltages V of the contact electrodes $P_{UPP}$ and $P_{LOW}$ provided on the membrane sheet 17 under the hitting portions 3-k (k=1-6). More specifically, the CPU of the operation detection apparatus 10A calculates a differential value $\Delta V$ of the output voltage V of the contact electrodes $P_{UPP}$ and $P_{LOW}$ provided on the membrane sheet 17 under each of the hitting portions 3-k, and, when the differential value $\Delta V$ has exceeded a predetermined threshold value, the CPU of the operation detection apparatus 10A determines that the hitting portion 3-k has been hit by the user.

Once hitting of any one of the hitting portions 3-k (k=1-6) is detected via the membrane sheet 17, the CPU of the operation detection apparatus 10A outputs a MIDI (Musical Instrument Digital Interface) message that is data for controlling a tone indicated by the icon I-k displayed under the hit hitting portion 3. More specifically, once any one of the hitting portions 3-k (k=1-6) is hit by the user, the CPU of the operation detection apparatus 10A sets, as hitting intensity value data DST-k, data obtained by converting the current differential value $\Delta V$ from analog representation into digital representation, and then converts the hitting intensity value data DST-k into a velocity Vel that is a MIDI parameter indicative of an intensity of a tone. Then, the CPU of the operation detection apparatus 10A generates a note-on MIDI message including the converted velocity Ve and supplies the generated MIDI message to the tablet-type computer 97 via the connectors CNF and CNM. Each time such a MIDI message is supplied from the operation detection apparatus 10A, the CPU of the tablet-type computer 97 performs two processes, i.e. tone generation control process and display control process. In the tone generation control process, the CPU of the tablet-type computer 97 selects a channel 1CH allocated to the hit hitting portion 3-k (e.g. 3-1) from among six channels kCH (k=1-6) allocated in advance to the six hitting portions 3-k (k=1-6), and then the CPU causes a tone of a color (timbre) of the selected channel kCH to be audibly generated or sounded as a tone of a volume corresponding to the velocity Vel included in the MIDI message. In the display control process, the CPU of the tablet-type computer 97 selects the icon I-1 of the hit hitting portion 3-1 from among the six icons I-k (k=1-6) on the display surface 199 and changes a display style (e.g., display color density) of the selected icon I-1 in accordance with the velocity Vel included in the MIDI message.

In the above-described second embodiment of the operation detection apparatus 10A, the transparent rigid member 18, membrane sheet 17 and transparent pad frame 16 are covered with the non-transparent cover 101, and the cover

101 has the openings 102-k (k=1-6). The hitting portions 3-k (k=1-6) of the transparent pad frame 16 are exposed through the openings 102-k (k=1-6). With such arrangements, content displayed on the display surface 199 of the tablet-type computer 97 in regions immediately under the hitting portions 3-k (k=1-6) can be seen through the hitting portions 3-k (k=1-6), while the contact electrodes P$_{UPP}$ and P$_{LOW}$ of the membrane sheet 17 are invisible by being hidden by the edge portions of the cover 101 defining the openings 102-k. Thus, with the second embodiment, the user can comfortably execute an intuitive performance in which the user hits the hitting portions 3-k while viewing the icons displayed in the regions immediately under the hitting portions 3-k (k=1-6), as with the first embodiment.

[Third Embodiment]

FIG. 10 is a view showing example constructions of a third embodiment of the operation detection apparatus 10B and a tablet-type computer 97 to which the operation detection apparatus 10B is attached. The tablet-type computer 97 used with the third embodiment of the operation detection apparatus 10B is identical in construction to the tablet-type computer 97 used with the second embodiment of the operation detection apparatus 10A. The third embodiment of the operation detection apparatus 10B is different from the second embodiment of the operation detection apparatus 10A in that it does not include the band 120 provided in the second embodiment and includes four sucking disks 251, 252, 253 and 254 provide on four corner portions of the reverse surface of the transparent rigid member 18. The operation detection apparatus 10B is attached to a desired position on the display surface 199 by the sucking disks 251, 252, 253 and 254 being pressed against the display surface 199. The third embodiment constructed in the aforementioned manner can achieve generally the same advantageous benefits as the second embodiment.

[Fourth Embodiment]

FIG. 11 is a view showing example constructions of a fourth embodiment of the operation detection apparatus 10C and a tablet-type computer 97 accommodated in the operation detection apparatus 10C. FIG. 12 shows the tablet-type computer 97 accommodated in the operation detection apparatus 10C. The tablet-type computer 97 used with the fourth embodiment of the operation detection apparatus 10C is identical in construction to the tablet-type computer 97 used with the second and third embodiments. The operation detection apparatus 10C includes a casing 370 having a horizontal dimension (width) W8, longitudinal dimension (length) L8 and thickness T8 slightly greater than those of the tablet-type computer 97, and an accommodating portion 371 provided in the casing 370 for accommodating therein the tablet-type computer 97.

In the above-described operation detection apparatus 10C, one side, in a direction of the thickness T8, of the accommodating portion 371 is partly covered with a surface 372 of the casing 370. The casing 370 has an opening that extends from one of opposite end surfaces 381 and 382, in a direction of the longitudinal dimension L8, of the casing 370 toward the other of the end surfaces 381 and 382 along the inner side edges of the surface 372, and the accommodating portion 371 is exposed to outside through the opening. A rectangular hole 373 is provided in a substantial middle portion, in a direction of the horizontal dimension W8, of the surface 372 covering the accommodating portion 371. Layers of the transparent rigid member 18, membrane sheet 17, transparent pad frame 16 and cover 101, which are identical in construction to those of the first embodiment of the operation detection apparatus 10A, are embedded in the rectangular hole 373. Two knobs 374 and 375 are provided on a region of the surface 372 adjacent to one of the side edges of the accommodating portion 371. Further, the casing 370 has a connector CN$_F$ (not shown in FIG. 11) provided on an inner surface thereof located behind the end surface 382 and facing the accommodating portion 371.

In this case, the tablet-type computer 97 is accommodated in the accommodating portion 371 of the operation detection apparatus 10C as follows. First, the tablet-type computer 97 is placed in a posture parallel to the operation detection apparatus 10C. Then, the connector CN$_M$ of the tablet-type computer 97 is oriented toward the accommodating portion 371 and connected to the connector CN$_F$ of the operation detection apparatus 10C, and the tablet-type computer 97 is inserted into the accommodating portion 371 from the side of the end surface 381. Next, the tablet-type computer 97 is pushed in a direction of a white arrow of FIG. 11 until the connector CN$_M$ of the tablet-type computer 97 is connected to the connector CN$_F$ of the operation detection apparatus 10C. Upon completion of connection between the connector CN$_F$ and the connector CN$_M$, the CPU of the tablet-type computer 97 and a CPU of the operation detection apparatus 10C execute performance processing in conjunction with each other. The performance processing performed here is identical in content to the performance processing described above in relation to the second embodiment.

With the tablet-type computer 97 accommodated in the operation detection apparatus 10C in the aforementioned manner as shown in FIG. 12, content displayed on the display surface 199 of the tablet-type computer 97 in regions immediately under the hitting portions 3-1 to 3-4 can be seen through the hitting portions 3-1 to 3-4. Further, in the state shown in FIG. 12, the contact electrodes P$_{UPP}$ and P$_{LOW}$ of the membrane sheet 17 are invisible by being hidden by the edge portions of the cover 101 defining the openings 102-k (k=1-6). Thus, with the third embodiment too, the user can comfortably execute an intuitive performance where the user hits the hitting portions 3-k while viewing the icons I-1 to I-4 displayed in the regions immediately under the hitting portions 3-k (k=1-6).

Whereas the present invention has been described above in relation to the first to fourth embodiments, various other embodiments of the present invention are also possible as exemplified below.

Figure 13:
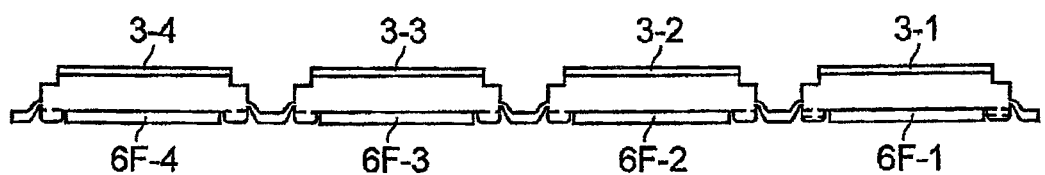
FIG. 13 is a sectional view of a transparent pad frame in a modified embodiment of the operation detection apparatus.

(1) In the first embodiment, each of the pusher portions 6F-k (k=1-6), 6B-k (k=1-6), 6L-1 to 6L-4 and 6R-1 to 6R-4 of the transparent pad frame 16 in the has a substantially arcuate surface such that it has the greatest thickness at its middle point. In a modified embodiment, as shown in a sectional view of FIG. 13 (corresponding to the sectional view taken along the A-A' line of FIG. 1), surfaces of all or one or some of the pusher portions 6F-k (k=1-6), 6B-k (k=1-6), 6L-1 to 6L-4 and 6R-1 to 6R-4 (6F-1, 6F-2, 6F-3 and 6F-4 in the illustrated example of FIG. 13) which face the flexible sheet 19 may be formed in a flat shape parallel to the flexible sheet 19.

Figure 14:
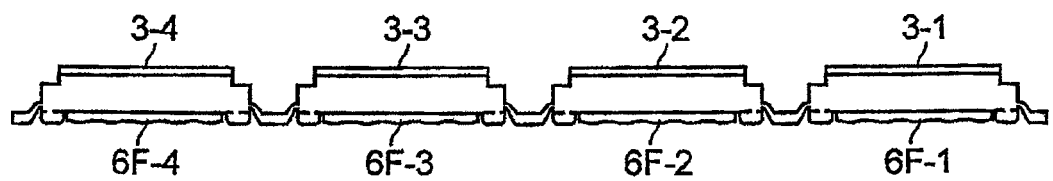
FIG. 14 is a sectional view of a transparent pad frame in another modified embodiment of the operation detection apparatus.

Further, as shown in a sectional view of FIG. 14 (corresponding to the sectional view taken along the A-A' line of FIG. 1), surfaces of all or one or some of the pusher portions 6F-k (k=1-6), 6B-k (k=1-6), 6L-1 to 6L-4 and 6R-1 to 6R-4 (6F-1, 6F-2, 6F-3 and 6F-4 in the illustrated example of FIG. 14) which face the flexible sheet 19 may be formed in a wave shape with gentle undulations repeated at a predetermined pitch.

Figure 15:
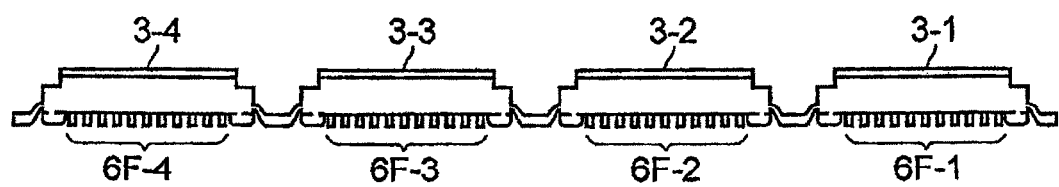
FIG. 15 is a sectional view of a transparent pad frame in still another modified embodiment of the operation detection apparatus.

Furthermore, as shown in a sectional view of FIG. 15 (corresponding to the sectional view taken along the A-A' line of FIG. 1), surfaces of all or one or some of the pusher portions 6F-k (k=1-6), 6B-k (k=1-6), 6L-1 to 6L-4 and 6R-1 to 6R-4 (6F-1, 6F-2, 6F-3 and 6F-4 in the illustrated example of FIG. 15) which face the flexible sheet 19 may be formed in a comb-tooth shape with tooth and valley portions repeated at a predetermined pitch.

Figure 16A:
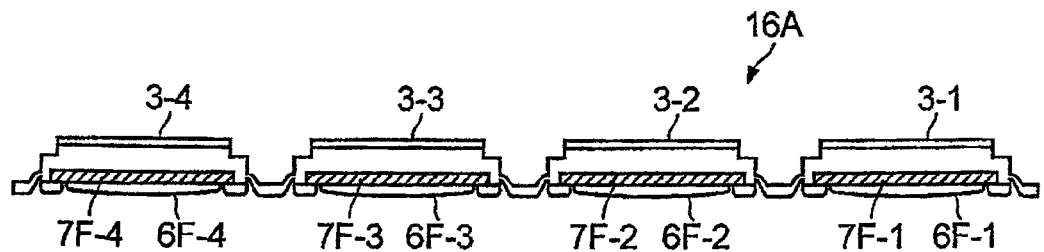
FIGS. 16A and 16B are a sectional view and bottom view, respectively, of a transparent pad frame in still another modified embodiment of the operation detection apparatus.
Figure 16B:
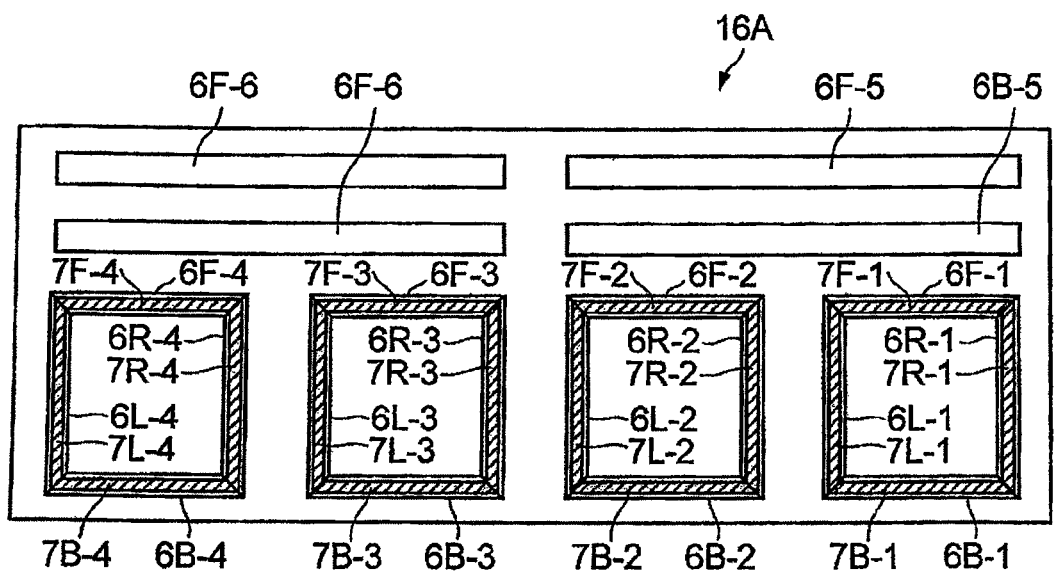

(2) In the first embodiment, transparent rigid members (e.g., transparent plastic members) may be embedded as cores in the pusher portions 6F-1 to 6F-4, 6B-1 to 6B-4, 6L-1 to 6L-4 and 6R-1 to 6R-4. FIG. 16A is a sectional view (corresponding to the sectional view taken along the A-A' line of FIG. 1) of a transparent pad frame 16A having such cores embedded in the pusher portions 6F-1 to 6F-4, 6B-1 to 6B-4, 6L-1 to 6L-4 and 6R-1 to 6R-4. FIG. 16B is a bottom view of the transparent pad frame 16A as viewed from the side of the membrane sheet 17.

In the modified embodiment, as shown in FIGS. 16A and 16B, core rods 7F-1 to 7F-4, each having a slightly smaller length and width than the pusher portions 6F-1 to 6F-4, are embedded in the pusher portions 6F-1 to 6F-4. Further, core rods 7B-1 to 7B-4, each having a slightly smaller length and width than the pusher portions 6B-1 to 6B-4, are embedded in the pusher portions 6B-1 to 6B-4. Further, core rods 7L-1 to 7L-4, each having a slightly smaller length and width than the pusher portions 6L-1 to 6L-4, are embedded in the pusher portions 6L-1 to 6L-4. Furthermore, core rods 7R-1 to 7R-4, each having a slightly smaller length and width than the pusher portions 6R-1 to 6R-4, are embedded in the pusher portions 6R-1 to 6R-4.

According to the modified embodiment, as any one of the hitting portions 3-k is hit by the user, the flexible sheet 19 is pressed by respective entire surfaces, facing the flexible sheet 19, of the corresponding pusher portions 6F-1-6F-4, 6B-1-6B-4, 6L-1-6L-4 and 6B-1-6B-4. Thus, a force with which the hitting portion 3-k has been hit (hitting force) can be transmitted to the flexible sheet 19 with an increased ease.

(3) In the above-described first embodiment of the operation detection apparatus 10, the transparent rigid member 18, membrane sheet 17 and transparent pad frame 16 are provided in layers on the display means in the form of the LCD 12 (display means). In a modified embodiment, the operation detection apparatus 10 comprising such a transparent rigid member 18, membrane sheet 17 and transparent pad frame 16 may be placed on another member which has displayed or printed thereon information indicative of the tone material data allocated to the hitting portions 3-k (k=1-6) of the transparent pad frame 16. For example, the operation detection apparatus 10 may be used in combination with a plurality of kinds of sheets having printed therein in advance six kinds of marks indicative of the tone material data allocated to the hitting portions 3-k (k=1-6) of the transparent pad frame 16.

The modified embodiment of the operation detection apparatus 10 is used as follows. First, one of the plurality of kinds of sheets is selected. Then, the operation detection apparatus 10 is placed on the sheets in such a manner that the hitting portions 3-k (k=1-6) overlap respective ones of the six kinds of marks (i.e., visual representations) printed on the sheets, and the tone material data indicated by the marks located under the respective hitting portions 3-k (k=1-6) are allocated to the respective hitting portions 3-k (k=1-6). Once hitting, by the user, of any one of the hitting portions 3-k is detected, the personal computer 91 reproduces the tone material data allocated to the hit hitting portion 3-k.

(4) In the above-described first embodiment, the transparent pad frame 16 and the transparent rigid member 18 are each formed of a transparent material. However, either or both of the pad frame 16 and rigid member 18 may be formed of a translucent material, (5) In the above-described first embodiment, letters and/or characters that are visual representations indicative of tone material data allocated to the hitting portions 3-k (k=1-6) may be displayed in the display area 15 immediately under the hitting portions 3-k (k=1-6).

(6) In the above-described first embodiment, the transparent pad frame 16 includes the plurality of transparent pads formed integrally with one another. As a modified embodiment, the transparent pad frame 16 may include only one transparent pad.

(7) The above-described first embodiment may be modified to include a tone source and a control section provided within the operation detection apparatus 10 so that a tone of a velocity corresponding to an intensity of hitting force (hitting intensity) applied to any one of the hitting portions 3-k (k=1-6) is reproduced by the operation detection apparatus 10 itself. Such a modified embodiment permits a performance without using the personal computer 91.

Figure 17:
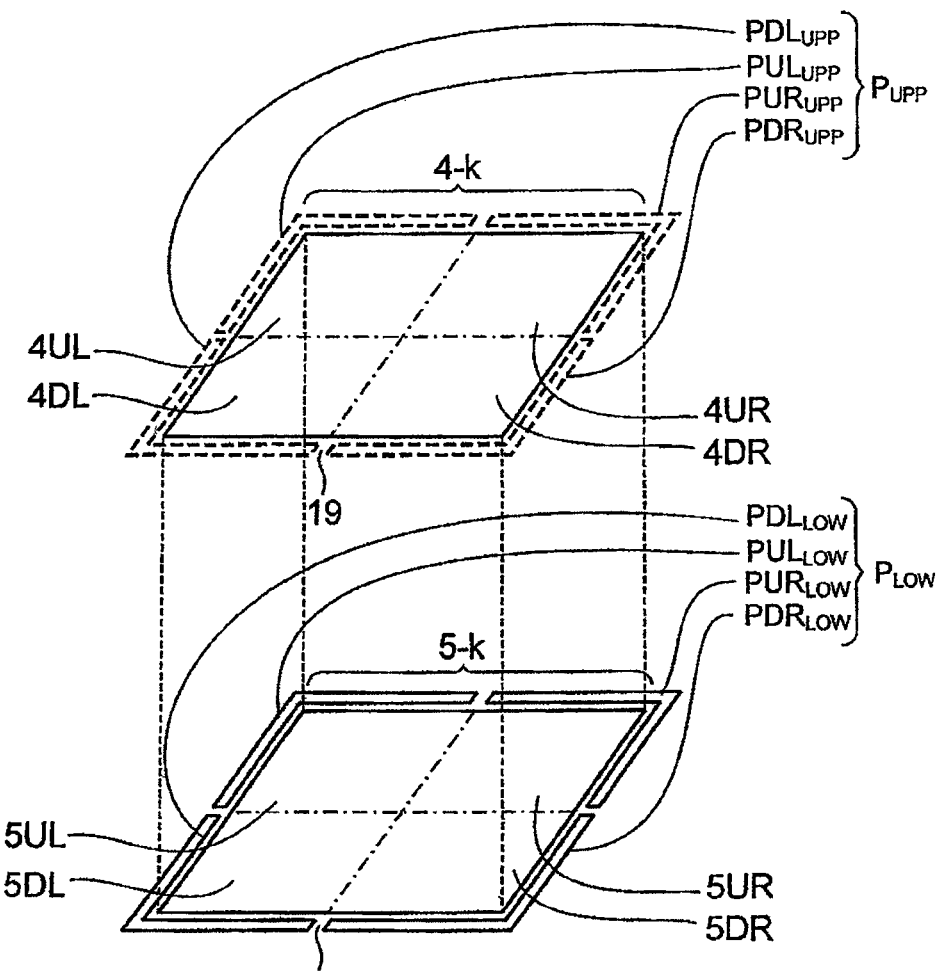
FIG. 17 is a view of a membrane sheet in still another modified embodiment of the operation detection apparatus.

(8) In the above-described first embodiment, a plurality of switches may be provided around each of the openings 4-k of the membrane sheet 17 for detecting intensities of hitting force (hitting intensities) applied to a plurality of regions of the corresponding hitting portion 3-k. Such a modified embodiment is implemented, for example, in the following manner. Namely, as shown in FIG. 17, the contact electrode $P_{UPP}$ provided on the reverse or inner surface of the flexible sheet 19 around the opening 4-k is constructed of L-shaped contact electrodes $PUL_{UPP}$, $PDL_{UPP}$, $PUR_{UPP}$ and $PDR_{UPP}$ each having a same size, and the contact electrode $P_{LOW}$ provided on the inner surface of the flexible sheet 20 around the opening 5-k is constructed of L-shaped contact electrodes $PUL_{LOW}$, $PDL_{LOW}$, $PUR_{LOW}$ and $PDR_{LOW}$ each having a same size.

More specifically, in the modified embodiment, the opening 4-k is divided by two intersecting centerlines (one-dot-dash lines in FIG. 17), connecting between two pairs of opposed sides of the opening 4-k, into four equal rectangular regions 4UL, 4DL, 4UR and 4DR. The contact electrode $PUL_{UPP}$ is provided on the reverse surface of the flexible sheet 19 in such a manner as to surround two outer sides of the region 4UL, and the contact electrode $PDL_{UPP}$ is provided on the reverse surface of the flexible sheet 19 in such a manner as to surround two outer sides of the region 4DL. Further, the contact electrode $PUR_{UPP}$ is provided on the reverse surface of the flexible sheet 19 in such a manner as to surround two outer sides of the region 4UR, and the contact electrode $PDR_{UPP}$ is provided on the reverse surface of the flexible sheet 19 in such a manner as to surround two outer sides of the region 4DR.

Further, the opening 5-k is divided by two intersecting centerlines (one-dot-dash lines in FIG. 17), connecting between two pairs of opposed sides of the opening 5-k, into four equal rectangular regions 5UL, 5DL, 5UR and 5DR. The contact electrode $PUL_{LOW}$ is provided on the inner surface (upper surface in the figure) of the flexible sheet 20 in such a manner as to surround two outer sides of the region 5UL, and the contact electrode $PDL_{LOW}$ is provided on the inner surface of the flexible sheet 20 in such a manner as to surround two outer sides of the region 5DL. Further, the contact electrode $PUR_{LOW}$ is provided on the inner surface of the flexible sheet 20 in such a manner as to surround two outer sides of the region 5UR, and the contact electrode $PDR_{LOW}$ is provided on the reverse surface of the flexible sheet 20 in such a manner as to surround two outer sides of the region 5DR.

Further, according to the modified embodiment, when a region of the hitting portion 3-k immediately over the regions 4UL and 5UL has been hit, the contact electrode $PUL_{UPP}$ of the flexible sheet 19 contacts the contact electrode $PUL_{LOW}$ of the flexible sheet 20, so that an output voltage V1 obtained from a circuit including the contact electrodes PUL$_{UPP}$ and PUL$_{LOW}$ increases as the area of contact between the contact electrodes PUL$_{UPP}$ and PUL$_{LOW}$ increases. Further, when a region of the hitting portion 3-k immediately over the regions 4DL and 5DL has been hit, the contact electrode PDL$_{UPP}$ of the flexible sheet 19 contacts the contact electrode PDL$_{LOW}$ of the flexible sheet 20, so that an output voltage V2 obtained from a circuit including the contact electrodes PDL$_{UPP}$ and PDL$_{LOW}$ increases as the area of contact between the contact electrodes PDL$_{UPP}$ and PDL$_{LOW}$ increases.

Further, when a region of the hitting portion 3-k immediately over the regions 4UR and 5UR has been hit, the contact electrode PUR$_{UPP}$ of the flexible sheet 19 contacts the contact electrode PUR$_{LOW}$ of the flexible sheet 20, so that an output voltage V3 obtained from a circuit including the contact electrodes PUR$_{UPP}$ and PUR$_{LOW}$ increases as the area of contact between the contact electrodes PUR$_{UPP}$ and PUR$_{LOW}$ increases. Furthermore, when a region of the hitting portion 3-k immediately over the regions 4DR and 5DR has been hit, the contact electrode PDR$_{UPP}$ of the flexible sheet 19 contacts the contact electrode PDR$_{LOW}$ of the flexible sheet 20, so that an output voltage V4 obtained from a circuit including the contact electrodes PDR$_{UPP}$ and PDR$_{LOW}$ increases as the area of contact between the contact electrodes PDR$_{UPP}$ and PDR$_{LOW}$ increases.

The modified embodiment constructed in the above-described manner can individually detect, on the basis of the output voltages V1, V2, V3 and V4, intensities of hitting force (hitting intensities) applied to the four regions of the hitting portion 3-k.

Figure 18:
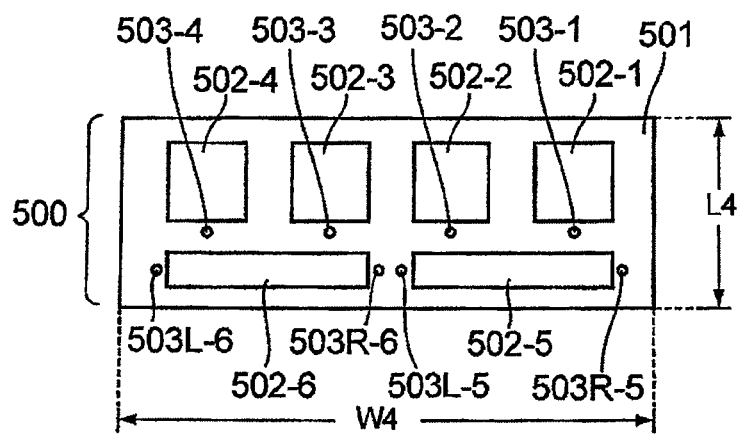
FIG. 18 is a diagram showing a construction of a hitting detection sheet in still another modified embodiment of the operation detection apparatus.

(9) In the above-described first to fourth embodiments, the two flexible sheets 19 and 20, constituting the membrane sheet 17, may be replaced with another type of pressure-sensitive members (e.g., force sensors or strain gauges). FIG. 18 is a diagram showing a construction of a hitting detection sheet 500 that is a pressure-sensitive member used in place of the flexible sheets 19 and 20. The hitting detection sheet 500 includes a plate member 501 having the same size as the flexible sheet 19 of the membrane sheet 17 (FIG. 1B) and having openings 502-k (k=1-6), and force sensors 503-1 to 503-4, 503L-5, 503R-5, 503L-6 and 503R-6 provided outside the openings 502-k (k=1-6). More specifically, the force sensor 503-1 is provided between the opening 502-1 and the opening 502-5 formed in the plate member 501, the force sensor 503-2 is provided between the opening 502-2 and the opening 502-5, the force sensor 503-3 is provided between the opening 502-3 and the opening 502-6, and the force sensor 503-4 is provided between the opening 502-4 and the opening 502-6. Further, the force sensors 503L-5 and 503R-5 are provided outside opposite ends, in the direction of the horizontal dimension W4, of the opening 502-5, and the force sensors 503L-6 and 503R-6 are provided outside opposite ends, in the direction of the horizontal dimension W4, of the opening 502-6.

The force sensors 503-1 to 503-4 of the hitting detection sheet 500 each function as a switch that is turned on in response to hitting of a corresponding one of the hitting portions 3-1 to 3-4, and the force sensors 503L-5, 503R-5, 503L-6 and 503R-6 each function as a switch that is turned on in response to hitting of a corresponding one of the hitting portions 3-5 and 3-6. More specifically, as any one of the hitting portions 3-1 to 3-4 (e.g., hitting portion 3-1) is hit by the user, the force sensor 503-1 is pressed by the hitting portion 3-1 so that the hitting force is applied to the force sensor 503-1. As the hitting force is applied to the hitting portion 3-1 like this, an output voltage V of the force sensor 503-1 increases in accordance with an intensity of the hitting force. The output voltage V of the force sensor 503-1 is converted by a not-shown A/D conversion section from an analog signal into a digital signal that is then transmitted to the personal computer 91 or tablet-type computer 97 as hitting intensity value data DST-1 indicative of the hitting intensity applied to the hitting portion 3-1. Further, as any one of the hitting portions 3-5 and 3-6 (e.g., hitting portion 3-5) is hit, the force sensors 503L-5 and 503R-5 are pressed by the hitting portion 3-5 so that the hitting force is applied to the force sensors 503L-5 and 503R-5. As the hitting force is applied to the force sensors 503L-5 and 503R-5 like this, an output voltage V of the force sensors 503L-5 and 503R-5 increases in accordance with an intensity of the hitting force. The output voltage V of the force sensors 503L-5 and 503R-5 is converted by a not-shown A/D conversion section from an analog signal into a digital signal that is then transmitted to the personal computer 91 or tablet-type computer 97 as hitting intensity value data DST-5 indicative of the hitting intensity applied to the hitting portion 3-5. The modified embodiment constructed in the above-described manner can achieve the same advantageous benefits as the first embodiment.

(10) The above-described second and third embodiments may be modified in such a manner that the displayed positions of the icons I-k (k=1-6) are automatically adjusted in accordance with the attached position, on the tablet-type computer 97, of the operation detection apparatus 10A or 10B. The tablet-type computer 97 used with the second and third embodiments includes a sensor provided thereon for detecting a position coordinate X in the direction of the horizontal dimension W7 and a position coordinate Y in the direction of the longitudinal dimension L7 of the operation detection apparatus 10A or 10B attached to the display surface 199 of the computer 97. On the basis of the signals indicative of the position coordinates X and Y output from the sensor, the tablet-type computer 97 calculates position coordinates XB-k (k=1-6) in the direction of the horizontal dimension W7 and position coordinates YB-k (k=1-6) in the direction of the longitudinal dimension L7 of displayed positions immediately under the individual hitting portions 3-k. Then, the tablet-type computer 97 adjusts the displayed positions, on the display surface 199, of the individual icons I-k to the displayed positions indicated by the position coordinates XB-k and position coordinates YB-k.

(11) The third embodiment of the operation detection apparatus 10B has been described as attached to the display surface 199 of the tablet-type computer 97 by the absorption force of the sucking disks 251, 252, 253 and 254 provide on the reverse surface of the transparent rigid member 18. As a modified embodiment, the sucking disks 251, 252, 253 and 254 may be replaced with gel-like sheets or hook-and-loop fasteners. In the case where the hook-and-loop fasteners are used, the hook-and-loop fasteners are provided on both of the reverse surface of the transparent rigid member 18 and the display surface 199 of the tablet-type computer 97.

(12) Whereas the first to fourth embodiments have been described above in relation to the case where the operation detection apparatus is used as a performance interface for executing a performance in response to hitting, with user's fingers, of the hitting portions 3-k (k=1-6), the application of the present invention is not so limited. For example, the operation detection apparatus of the present invention may be used as an electronic percussion instrument for practicing a drum performance. For that purpose, the hitting portions 3-k (k=1-6) of the first embodiment of the operation detection apparatus 10 are each formed in a true circular shape simulating a striking surface of a percussion instrument. Pictures indicating individual hitting portions 3-k to be hit are sequentially displayed at positions of the display area 13 immediately under the hitting portions 3-k (k=1-6). The user executes a performance by sequentially hitting, with sticks gripped with its hands, the hitting portions 3-k for which the pictures are displayed and seen thereunder one after another. Further, the operation detection of the present invention may be used as a health check meter having a function for supporting walking motion of the user. For that purpose, the first embodiment of the operation detection apparatus 10 is increased in size to the extent that a foot of the user can be placed on each of the hitting portions 3-k (k=1-6). Then, pictures indicating individual hitting portions 3-k to be stepped on by user's foot soles are sequentially displayed at positions of the display area 13 immediately under the hitting portions 3-k (k=1-6). The user performs walking motion by sequentially stepping, with its foot soles, the hitting portions 3-k for which the pictures are displayed and seen thereunder one after another. In such a case, other images than pictures, such as a graph showing a transition of a user's health state, may be displayed at positions of the display area 13 immediately under the hitting portions 3-k.

(13) The fourth embodiment of the operation detection apparatus 10C may be reduced in size to construct a small-size operation detection apparatus that operates a smart phone accommodated in the small-size operation detection apparatus.

This application is based on, and claims priorities to, JP PA 2010-160474 filed on 15 Jul. 2010 and JP PA 2010-248085 filed on 5 Nov. 2010. The disclosure of the priority applications, in its entirety, including the drawings, claims, and the specification thereof, are incorporated herein by reference.

What is claimed is:

1. An operation detection apparatus comprising:
a pad that is transparent or translucent and including at least one hitting portion provided on a surface thereof, the hitting portion being suitable for being hit; and
a sensor section, provided in a region positionally corresponding to the hitting portion under said pad, that detects hitting of the hitting portion,
wherein said sensor section is sheet-shaped as a whole and comprises:
a see-through portion provided in association with the hitting portion for allowing a region below said sensor section to be partly seen therethrough, the see-through portion being an opening provided in a predetermined position of the sheet-shaped sensor section;
a display area disposed under said sensor section so that the display area is exposed through the opening; and
a pressure-sensitive member that detects presence or absence of pressure responsive to the hitting portion being hit.

2. The operation detection apparatus as claimed in claim 1, further comprising a control section that, in response to said sensor section detecting the hitting portion being hit, outputs tone control data allocated to the hit hitting portion.

3. The operation detection apparatus as claimed in claim 1, wherein the pressure-sensitive member includes a contact that turns on or off in response to presence or absence of the pressure responsive to the hitting portion being hit.

4. The operation detection apparatus as claimed in claim 3, wherein the contact comprises two contact electrodes and provides, on the basis of an area of contact between the two contact electrodes, data indicative of a hitting intensity applied to the hitting portion.

5. The operation detection apparatus as claimed in claim 1, wherein the pressure-sensitive member outputs data indicative of presence or absence of hitting of the hitting portion and a hitting intensity applied to the hitting portion.

6. The operation detection apparatus as claimed in claim 1, wherein:
said pad includes a pusher portion projecting toward the pressure-sensitive member provided on a reverse surface region of said pad positionally corresponding to the hitting portion, and
wherein pressure responsive to the hitting portion being hit is transmitted via the pusher portion to the pressure-sensitive member.

7. The operation detection apparatus as claimed in claim 6, wherein:
the pusher portion is provided on the reverse surface region of said pad opposite from a peripheral edge of the hitting portion, and
a visual representation displayed in the display area is visible through the opening from above the hitting portion without being blocked by the pusher portion.

8. The operation detection apparatus as claimed in claim 7, wherein:
the pusher portion includes at least one straight line portion corresponding to at least one side of the peripheral edge of the hitting portion, and
wherein the at least one straight line portion varies in width, with a greatest width at a substantially middle point thereof.

9. The operation detection apparatus as claimed in claim 1, wherein a visual representation indicative of a function allocated to the hitting portion is displayed in the display area in association with the hitting portion.

10. The operation detection apparatus as claimed in claim 9, further comprising a transparent rigid member provided under said sensor section and over the display area.

11. The operation detection apparatus as claimed in claim 10, wherein the transparent rigid member is adapted to be disposed over a display surface of the display area with a gap therebetween.

12. The operation detection apparatus as claimed in claim 11, further comprising a flat display panel having a first display area, at least part of the first display area constituting said display area disposed under said sensor section.

13. The operation detection apparatus as claimed in claim 12, wherein the flat display panel further includes:
a second display area located other than under said sensor section; and
a transparent touch panel that detects a touch on a panel surface thereof disposed over at least said second display area.

14. The operation detection apparatus as claimed in claim 13, wherein said sensor section, said flat display panel, and said touch panel are configured to be connected to a computing device.

15. The operation detection apparatus as claimed in claim 11, further comprising:
a mechanism configured to detachably attach or position the operation detection apparatus in relation to a flat display device
wherein the flat display device comprises a transparent touch panel and a first display area, part of a first display area constituting said display area disposed under said sensor section.

16. The operation detection apparatus as claimed in claim 15, wherein the mechanism comprises a band.

17. The operation detection apparatus as claimed in claim 15, wherein the mechanism comprises at least one suction cup.

18. The operation detection apparatus as claimed in claim 15, wherein the mechanism comprises an accommodating portion that positions the flat display device in a predetermined position in relation to the operation detection apparatus.

19. The operation detection apparatus as claimed in claim 15, further comprising:
   a connection portion for connecting said sensor section to an external device,
   wherein the flat display device is a tablet-type computer having a computer incorporated therein, and
   wherein said operation detection apparatus is connectable to the tablet-type computer via the connection portion and functions as an auxiliary input device of the tablet-type computer.

* * * * *